(12) United States Patent
Ivanov et al.

(10) Patent No.: US 7,344,947 B2
(45) Date of Patent: Mar. 18, 2008

(54) METHODS OF PERFORMANCE IMPROVEMENT OF HVMOS DEVICES

(75) Inventors: Victor Ivanov, Richardson, TX (US); Jozef Czeslaw Mitros, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 175 days.

(21) Appl. No.: 11/412,511

(22) Filed: Apr. 27, 2006

(65) Prior Publication Data

US 2007/0212838 A1  Sep. 13, 2007

Related U.S. Application Data

(60) Provisional application No. 60/781,354, filed on Mar. 10, 2006.

(51) Int. Cl.
*H01L 21/336* (2006.01)

(52) U.S. Cl. ............... 438/286; 438/238; 438/282; 438/289; 438/290; 438/291; 438/292; 438/305; 438/306; 257/E21.427

(58) Field of Classification Search ............... 438/210, 438/224, 251, 252, 282, 290, 292
See application file for complete search history.

(56) References Cited

U.S. PATENT DOCUMENTS

| | | | |
|---|---|---|---|
| 5,296,393 A | 3/1994 | Smayling et al. | |
| 5,604,369 A | 2/1997 | Duvvury et al. | |
| 5,976,942 A | 11/1999 | Ludikhuize | |
| 6,333,234 B1 | 12/2001 | Liu | |
| 6,548,874 B1 | 4/2003 | Morton et al. | |
| 6,660,603 B2 | 12/2003 | Mitros | |
| 6,804,095 B2 | 10/2004 | Kunz et al. | |
| 2006/0113592 A1* | 6/2006 | Pendharkar et al. | 257/335 |
| 2006/0286741 A1* | 12/2006 | Pan et al. | 438/238 |

* cited by examiner

Primary Examiner—Michael S. Lebentritt
Assistant Examiner—Kyoung Lee
(74) Attorney, Agent, or Firm—W. James Brady, III; Frederick J. Telecky, Jr.

(57) ABSTRACT

Methods fabricate DEMOS devices having varied channel lengths and substantially similar threshold voltages. A threshold voltage is selected for first and second devices. First and second well regions are formed. First and second drain extension regions are formed within the well regions. First and second back gate regions are formed within the well regions according to the selected threshold voltage. First and second gate structures are formed over the first and second well regions having varied channel lengths. A first source region is formed in the first back gate region and a first drain region is formed in the first drain extension region. A second source region is formed in the second back gate region and a second drain region is formed in the drain extension region.

21 Claims, 5 Drawing Sheets

METHODS OF PERFORMANCE IMPROVEMENT OF HVMOS DEVICES

RELATED APPLICATION

This application claims priority to U.S. Provisional Application No. 60/781,354 filed Mar. 10, 2006, which is entitled "METHODS OF PERFORMANCE IMPROVEMENT OF HVMOS DEVICES".

FIELD OF INVENTION

The present invention relates generally to semiconductor devices and more particularly to uniform threshold voltages for drain extended MOS transistors of varied channel lengths and fabrication methods thereof.

BACKGROUND OF THE INVENTION

Many integrated circuit devices include digital circuitry formed of metal-oxide-semiconductor (MOS) transistor devices, which are built using complementary MOS (CMOS) fabrication processes optimized for high-density, high-speed N-channel and P-channel MOS transistors. Such high-density circuitry is common in modern consumer electronic products such as wireless communications devices, portable computers, etc., in which digital circuitry is powered by batteries.

Many devices require MOS devices operable for low voltage applications and high voltage applications. For example, logic operations typically employ low voltage MOS devices, for example about 1.8 V where as power operations typically employ high voltage MOS devices, for example greater than 6 V. MOS devices for low voltage and high voltage applications can be and often are implemented on a single die or integrated circuit in order to conserve space and cost of fabrication.

A type of MOS transistor device employed in semiconductor devices is an N or P channel drain-extended metal-oxide-semiconductor (DEMOS) transistor device. The DEMOS devices are often employed for applications such as power switching circuits. The DEMOS devices employ a drain extension region which substantially increases operating voltages for the devices. Some examples of DEMOS devices include lateral diffused MOS (LDMOS) devices, REduced SURface Field (RESURF) transistors, and the like. DEMOS devices advantageously combine short-channel operation with high current handling capabilities, relatively low drain-to-source on-state resistance (Rdson), and the ability to withstand relatively high drain-to-source voltages without suffering voltage breakdown failure, where DEMOS device designs often involve a tradeoff between breakdown voltage (BVdss) and Rdson. In addition to performance advantages, DEMOS device fabrication is relatively easy to integrate into CMOS process flows, facilitating use in devices where logic, low power analog, or other circuitry is also to be fabricated in a single integrated circuit (IC).

A class of DEMOS transistor devices typically employed in high voltage applications are high voltage MOS (HVMOS) transistor devices. HVMOS devices include a thicker dielectric layer and a back gate region in addition to the drain extension region. HVMOS devices can be fabricated with low voltage CMOS devices and can use the N and P wells of the low voltage CMOS devices as back gate regions and/or drain extension regions. This can save space and cost during fabrication, but can also result in HVMOS devices having varied channel lengths. Threshold voltages for HVMOS devices are generally a function of channel length, so this also results in HVMOS devices having varied threshold voltages. The varied threshold voltages can cause memory operations, such as programming and reading, to be difficult to implement.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the present invention facilitate fabrication of drain extended semiconductor devices. Fixed back gate lengths, also referred to as POLY overlaps, are employed for devices having varied channel lengths in order to have substantially similar threshold voltage values. Gap length values, which are distances between back gate regions and drain extension regions, can be increased to obtain greater channel lengths. As a result, threshold values can be selected at or near minimum channel length values and still be employed for other channel lengths of greater value.

A method for fabricating DEMOS devices having varied channel lengths and substantially similar threshold voltages is provided. A threshold voltage is selected for first and second devices. First and second well regions are formed. First and second drain extension regions are formed within the well regions. First and second back gate regions are formed within the well regions according to the selected threshold voltage. First and second gate structures are formed over the first and second well regions having varied channel lengths. A first source region is formed in the first back gate region and a first drain region is formed in the first drain extension region. A second source region is formed in the second back gate region and a second drain region is formed in the drain extension region. Other systems and methods are disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
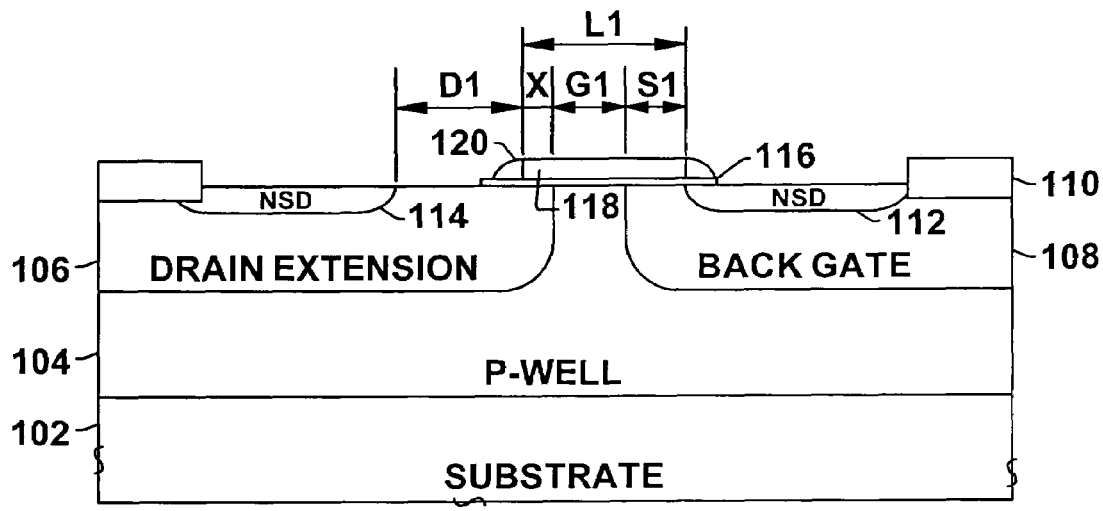
FIGS. 1A and 1B are cross sectional views of conventional HVMOS transistor devices having varied channel lengths and varied threshold voltages.

One or more implementations of the present invention will now be described with reference to the attached drawings, wherein like reference numerals are used to refer to like elements throughout, and wherein the illustrated structures are not necessarily drawn to scale.

Aspects of the present invention include methods that fabricate drain extended MOS (DEMOS) transistor devices of varied channel lengths and similar threshold voltages. Fixed back gate lengths, also referred to as POLY overlaps, are employed for devices having varied channel lengths in order to have substantially similar threshold voltage values. Gap length values, which are distances between back gate regions and drain extension regions, can be increased to obtain greater channel lengths while keeping the back gate lengths constant. As a result, threshold values can be selected at or near minimum channel length values and still be employed for other channel lengths of greater value.

Figure 1B:
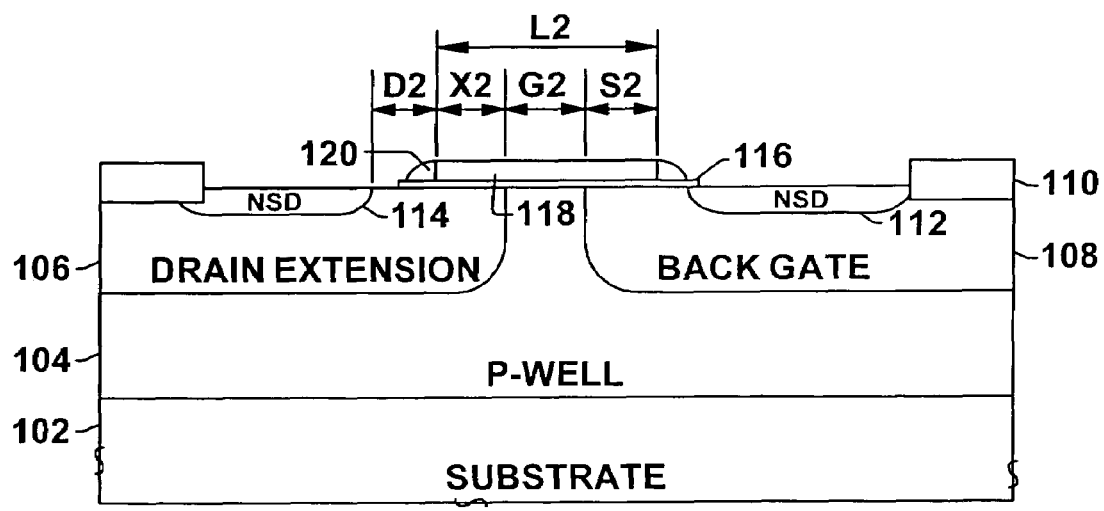

FIGS. 1A and 1B are cross sectional views of conventional high voltage DEMOS (HVMOS) transistor devices having varied channel lengths and varied threshold voltages. FIG. 1A depicts a first device having a channel length of L1. A p-well region 104 is formed and/or present on a semiconductor body or substrate 102. The pwell region 104 typically has a relatively low dopant concentration. The p-well region can also be an epitaxial layer or other layer having p-type conductivity.

A drain extension region 106 is formed within the pwell region 104 having an opposite conductivity. In this example, the drain extension region 106 has n-type conductivity. A back gate region 108 is also formed within the pwell region 104. The back gate region 108 has the same conductivity type as the pwell region 104, but typically has a higher dopant concentration. In this example, the back gate region 108 is of p-type conductivity.

Isolation structures 110, such as shallow trench isolation structures (STI), LOCOS, and the like, are present to isolate individual transistor devices. Typically, these are formed prior to pwell 104 or drain extension region 106 formation.

A source region 112 is formed within the back gate region 108. The source region 112 has an opposite conductivity of the pwell region 104, which in this example is n-type conductivity. A drain region 114 is formed within the drain extension region 106. The drain region 114 also has an opposite conductivity of the pwell region 104, which in this example is n-type. The drain region 114 has the same conductivity type as the drain extension region 106, but has a higher dopant concentration.

A gate structure comprising a gate dielectric layer 116, sidewalls 120, and a gate 118 is formed over the pwell region 104. Generally, the gate structure is formed prior to forming the source region 112 and the drain region 114. Typically, the gate dielectric layer 116 is formed on the pwell region 104 and the gate layer 118 is formed on the gate dielectric layer 116. Subsequently, the gate dielectric layer 116 and the gate layer 118 are patterned and the sidewall spacers 120 are formed.

According to the inventors of the present invention, the channel length L1 and, as a result, threshold voltage for the first device is dependent on a drain extension length X1, a gap region length G1 (also referred to as POLY overlap), and a back gate length S1. The drain extension length X1 is from an edge of the drain extension region 106 to a first edge of the gate 120, where the first edge is above the drain extension region 106. The gap region length G1 is a length from the edge of the drain extension region 106 to an edge of the back gate region 108. The back gate length S1 is a length from the edge of the back gate region to a second edge of the gate 120, where the second edge is located above the back gate region 108.

FIG. 1B depicts a second HVMOS device having a channel length of L2, which is longer than the channel length L1 of the first device. As a result, the second device has a varied threshold voltage from the first device. The second device is structured and formed in a similar manner as the first device of FIG. 1A. As a result, some of the description below is omitted and the discussion of FIG. 1A, above, can be referenced for further detail.

A p-well region 104 is formed and/or present on a semiconductor body or substrate 102. The pwell region 104 typically has a relatively low dopant concentration. A drain extension region 106 is formed within the pwell region 104 having an opposite conductivity. In this example, the drain extension region 106 has n-type conductivity. A back gate region 108 is also formed within the pwell region 104. The back gate region 108 has the same conductivity type as the pwell region 104, but typically has a higher dopant concentration. In this example, the back gate region 108 is of p-type conductivity.

Isolation structures 110, such as shallow trench isolation structures (STI), LOCOS, and the like, are present to isolate individual transistor devices. A source region 112 is formed within the back gate region 108. The source region 112 has an opposite conductivity of the pwell region 104, which in this example is n-type conductivity. A drain region 114 is formed within the drain extension region 106. The drain region 114 also has an opposite conductivity of the pwell region 104, which in this example is n-type. The drain region 114 has the same conductivity type as the drain extension region 106, but has a higher dopant concentration.

A gate structure comprising a gate dielectric layer 116, sidewalls 120, and a gate 118 is formed over the pwell region 104. Generally, the gate structure is formed prior to forming the source region 112 and the drain region 114.

According to the inventors of the present invention, the channel length L2 and, as a result, threshold voltage for the first device is dependent on a drain extension length X2, a gap region length G2, and a back gate length S2. The drain extension length X2 is from an edge of the drain extension region 106 to a first edge of the gate 120, where the first edge is above the drain extension region 106. The gap region length G2 is a length from the edge of the drain extension region 106 to an edge of the back gate region 108. The back gate length S2 is a length from the edge of the back gate region to a second edge of the gate 120, where the second edge is located above the back gate region 108.

Significant roll-off of threshold voltage occurs for symmetric and asymmetric DEMOS devices, such as the first and second devices in FIGS. 1A and 1B. The roll-off of threshold voltage is a function of the channel length. As a result, long channel drain extended devices have higher threshold voltages than short channel devices. This is possibly due, at least in part, to a limited source of diffusion from the back gate region or well.

The inventors of the present invention recognize that the channel length L2 is comprised of the drain extension length X2, the gap region length G2, and the back gate length S2. With dopant types and concentrations being equal, increasing the three above lengths, X2, G2, and S2, results in increasing the threshold voltage for the second device. However, the inventors of the present invention note that the back gate length S2 has a more substantial impact on the threshold voltage than the drain extension length X2 and the gap region length G2. The gap regions is a much lighter doped region than the back gate region and, therefore has a minimal impact on the threshold voltage. As a result, aspects of the present invention include fabricating symmetric and asymmetric DEMOS transistor devices having varied channel lengths but substantially similar threshold voltages by maintaining similar or substantially similar back gate lengths for varied length DEMOS transistor devices. Additionally, shorter minimum channel lengths can be employed for various DEMOS devices by employing substantially similar back gate lengths.

It is noted that FIGS. 1A and 1B depict NMOS devices, however conventional PMOS devices also have the above identified issues.

Figure 2A:
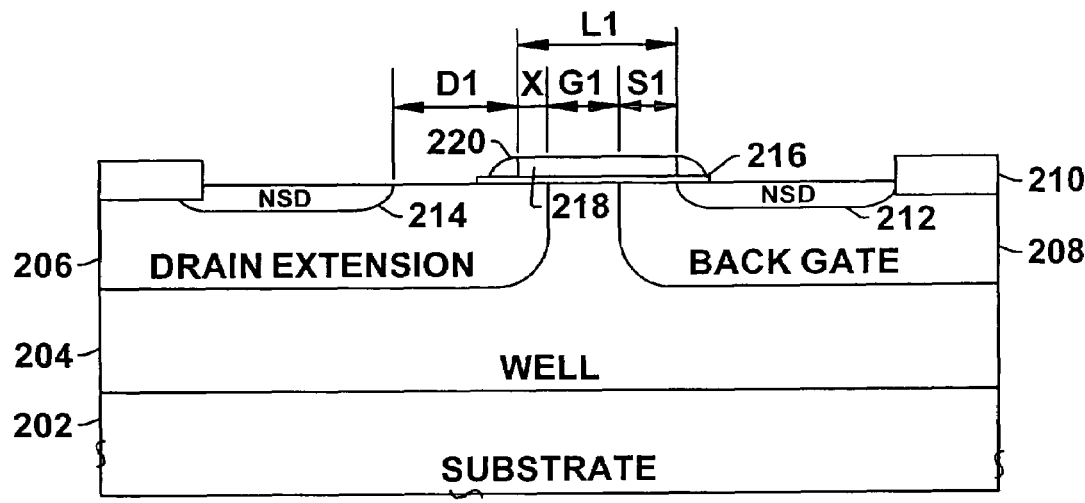
FIGS. 2A and 2B depict first and second asymmetric HVMOS transistor devices having varied channel lengths, but substantially similar threshold voltages in accordance with an aspect of the present invention.
Figure 2B:
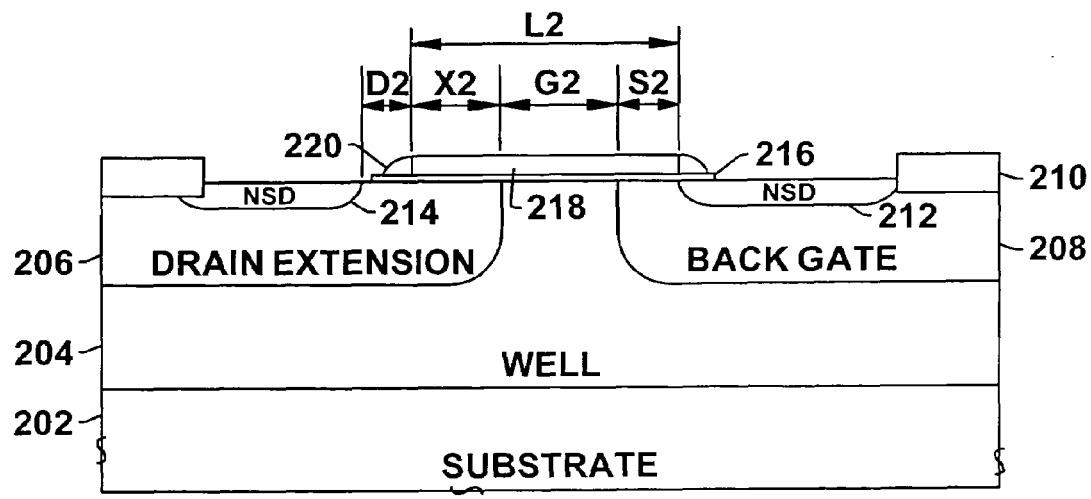

FIGS. 2A and 2B depict first and second asymmetric HVMOS transistor devices having varied channel lengths, but substantially similar threshold voltages in accordance with an aspect of the present invention. Methods for forming such devices are provided infra. A first HVMOS transistor device is depicted in FIG. 2A. The first device has a channel length L1, which, in this example, is a about a minimum channel length Lmin.

A well region 204 having a first type conductivity is formed and/or present on a semiconductor body or substrate 202. The well region 204 typically has a relatively low dopant concentration. The well region can also be an epitaxial layer or other layer having the first type conductivity, n-type or p-type.

A drain extension region 206 is formed within the well region 204 having a second conductivity type, opposite the conductivity type of the well region 204. A back gate region 208 is also formed within the well region 204 and has the same conductivity type as the well region 204, but typically has a higher dopant concentration. The back gate region 208 has a selected back gate length S1 and dopant concentration according to a desired and/or selected threshold voltage for the device.

Isolation structures 210 are present to isolate individual transistor devices. The isolation structures 210 can be local oxidation structures (LOCOS), shallow trench isolation regions (STI), or another suitable integrated circuit isolation scheme. Typically, these are formed prior to the well region 204 or the drain extension region 206 formation.

A source region 212 is formed within the back gate region 208. The source region 212 has an opposite conductivity of the well region 204, which in the second type conductivity. A drain region 214 is formed within the drain extension region 206. The drain region 214 also has an opposite conductivity of the well region 204. The drain region 214 has the same conductivity type as the drain extension region 206, but has a higher dopant concentration.

A gate structure comprising a gate dielectric layer 216, sidewalls 220, and a gate 218 is formed over the well region 204. Generally, the gate structure is formed prior to forming the source region 212 and the drain region 214. Typically, the gate dielectric layer 216 is formed on the well region 204 and the gate layer 218, such as polysilicon, is formed on the gate dielectric layer 216. Subsequently, the gate dielectric layer 216 and the gate layer 218 are patterned and the sidewall spacers 220 are formed.

According to the inventors of the present invention, the threshold voltage for the first device is substantially dependent upon the back gate region, in particular, the back gate length S1 and the dopant concentration of the back gate region. A drain extension length X1 is from an edge of the drain extension region 206 to a first edge of the gate 220, where the first edge is above the drain extension region 206. A gap region length G1 is a length from the edge of the drain extension region 206 to an edge of the back gate region 208. The back gate length S1 is a length from the edge of the back gate region to a second edge of the gate 220, where the second edge is located above the back gate region 208.

A second HVMOS transistor device is depicted in FIG. 2B. The second device has a channel length L2, which, in this example, is greater than the channel length L1 of the device of FIG. 2A. This second device is similar to the first device and some description is omitted herein. For additional details, please see the description above for FIG. 2A.

A well region 204 having a first type conductivity is formed and/or present on a semiconductor body or substrate 202. The well region 204 typically has a relatively low dopant concentration. A drain extension region 206 is formed within the well region 204 having a second conductivity type, opposite the conductivity type of the well region 204.

A back gate region 208 is formed within the well region 204 and has the same conductivity type as the well region 204, but typically has a higher dopant concentration. The back gate region 208 has a selected back gate length S2 and dopant concentration about equal to that of the first device. Thus, the second HVMOS device has a threshold voltage about equal that of the first device of FIG. 2A.

Isolation structures 210 are present to isolate individual transistor devices. The isolation structures 210 can be local oxidation structures (LOCOS), shallow trench isolation regions (STI), or another suitable integrated circuit isolation scheme. Typically, these are formed prior to the well region 204 or the drain extension region 206 formation.

A source region 212 is formed within the back gate region 208. The source region 212 has an opposite conductivity of the well region 204, which in the second type conductivity. A drain region 214 is formed within the drain extension region 206. The drain region 214 also has an opposite conductivity of the well region 204. The drain region 214 has the same conductivity type as the drain extension region 206, but has a higher dopant concentration.

A gate structure comprising a gate dielectric layer 216, sidewalls 220, and a gate 218 is formed over the well region 204. Generally, the gate structure is formed prior to forming the source region 212 and the drain region 214. Typically, the gate dielectric layer 216 is formed on the well region 204 and the gate layer 218 is formed on the gate dielectric layer 216. Subsequently, the gate dielectric layer 216 and the gate layer 218 are patterned and the sidewall spacers 220 are formed.

According to the inventors of the present invention, the threshold voltage for the first device is substantially dependent upon the back gate region, in particular, the back gate length S2 (poly overlap) and the dopant concentration of the back gate region 204. In this example, the back gate length S2 and the dopant concentration are about equal to the back gate length S1 and the dopant concentration for the first HVMOD transistor device. A drain extension length X2 is from an edge of the drain extension region 206 to a first edge of the gate 220, where the first edge is above the drain extension region 206. The drain extension length X2 is greater than the length X1 of FIG. 2A but this increase in length does not substantially impact or alter the threshold voltage. A gap region length G2 is a length from the edge of the drain extension region 206 to an edge of the back gate region 208. The gap region length G2 is also greater than the gap regions length G1 of FIG. 2A but also does not substantially impact or alter the threshold voltage of the second HVMOS transistor device. As stated previously, the gap region has a lighter doping and much less of an impact on threshold voltage than that of the back gate length S2. Generally, G2 is chosen to be increased in order to increase channel length without altering the threshold voltage.

Thus, the second device has a threshold voltage substantially equal to that of the first device of FIG. 2A despite having a channel length L2 greater than the channel length L1.

It is noted that the back gate lengths S1 and S2 shown in FIGS. 2A and 2B are equal when formed, but can vary after diffusion and/or other processing and have some variations in length. FIGS. 2A and 2B refrain from showing such variations in order to facilitate a better understanding of the present invention.

Additionally, it is appreciated that aspects of the present invention include DEMOS devices and are not limited to HVMOS devices.

Figure 3A:
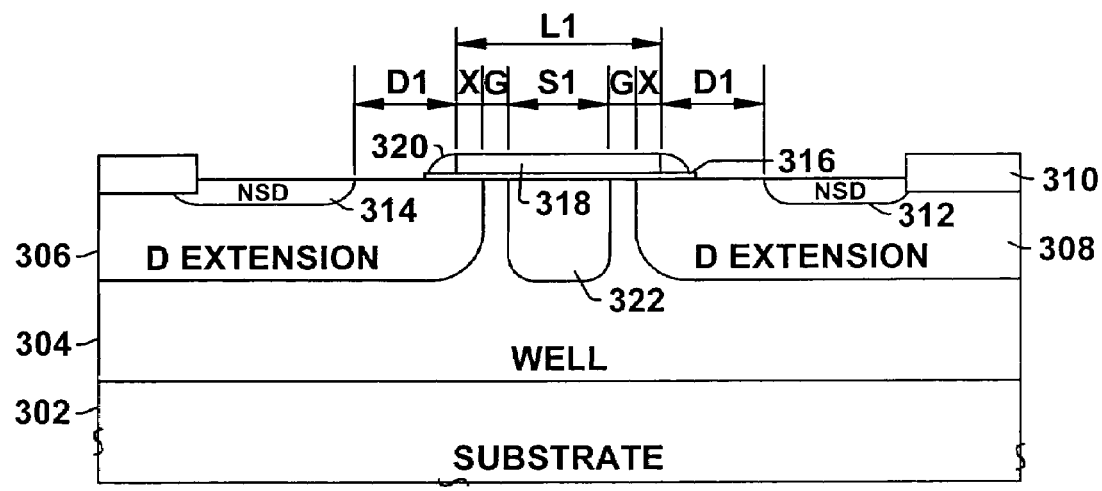
FIGS. 3A and 3B depict first and second symmetric HVMOS transistor devices having varied channel lengths, but substantially similar threshold voltages in accordance with an aspect of the present invention.
Figure 3B:
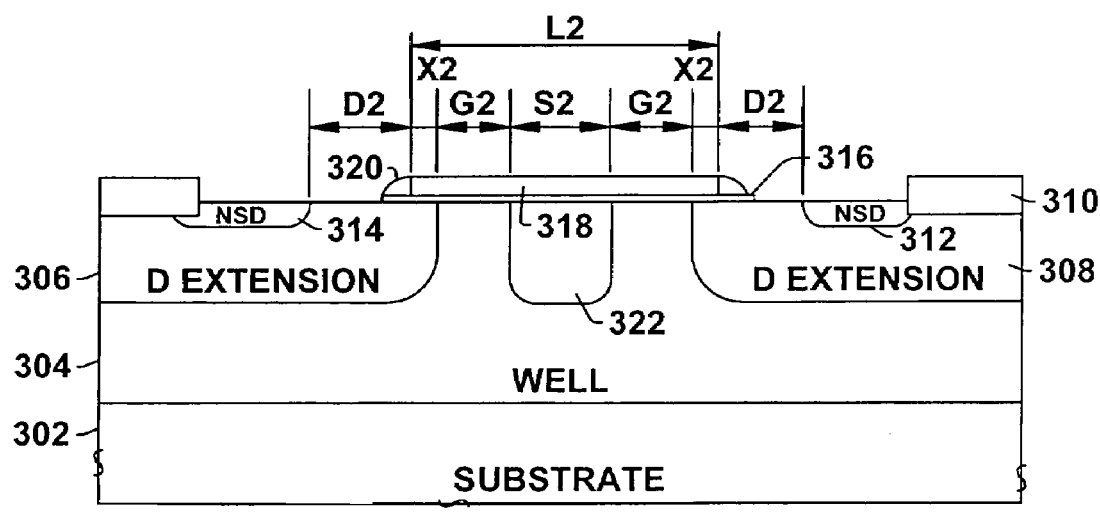

FIGS. 3A and 3B depict first and second symmetric HVMOS transistor devices having varied channel lengths, but substantially similar threshold voltages in accordance with an aspect of the present invention. Symmetric transistor devices have source and drain regions indistinguishable from each other. Methods for forming such devices are provided infra. A first symmetric HVMOS transistor device is depicted in FIG. 3A. The first device has a channel length L1, which, in this example, is a about a minimum channel length Lmin.

A well region 304 having a first type conductivity is formed and/or present on a semiconductor body or substrate 302. The well region 304 typically has a relatively low dopant concentration. The well region can also be an epitaxial layer or other layer having the first type conductivity, n-type or p-type.

First and second drain extension regions 306 and 308 are formed within the well region 304. The first and second drain extension regions 306 and 308 are symmetrical and have a second conductivity type, opposite the conductivity type of the well region 304. A back gate region 322 is also formed within the well region 304 in between the first and second drain extension regions 306 and 308. The back gate region has the same conductivity type as the well region 304, but typically has a higher dopant concentration. The back gate region 308 has a selected back gate length S1 and dopant concentration according to a desired and/or selected threshold voltage for the device.

Isolation structures 310 are present to isolate individual transistor devices. The isolation structures 310 can be local oxidation structures (LOCOS), shallow trench isolation regions (STI), or another suitable integrated circuit isolation scheme. Typically, these are formed prior to the well region 304 or the drain extension regions 306 and 308 formation.

A first source/drain region 314 is formed within the first drain extension region 306. The first source/drain region 314 has the second type conductivity which is opposite that of the well region 304. A second source/drain region 312 is formed within the second drain extension region 308. The second source/drain region 312 has the second type conductivity which is opposite that of the well region 304. The first source/drain region 314 and the second source/drain region 312 are symmetrical.

A gate structure comprising a gate dielectric layer 316, sidewalls 320, and a gate 318 is formed over the well region 304. Generally, the gate structure is formed prior to forming the source region 312 and the drain region 314. Typically, the gate dielectric layer 316 is formed on the well region 304 and the gate layer 318 is formed on the gate dielectric layer 316. Subsequently, the gate dielectric layer 316 and the gate layer 318 are patterned and the sidewall spacers 320 are formed.

According to the inventors of the present invention, the threshold voltage for the first device is substantially dependent upon the back gate region, in particular, the back gate length S1 and the dopant concentration of the back gate region. A drain extension length X1 is from an edge of the drain extension region 306 to a first edge of the gate 320, where the first edge is above the drain extension region 306. A gap region length G1 is a length from the edge of the drain extension region 306 to an edge of the back gate region 308. The back gate length S1 is a length from a first edge of the back gate region 322 to a second edge of the back gate region 322. The total channel length L1 is equal to 2*X1+ 2*G1+S1.

A second symmetric HVMOS transistor device is depicted in FIG. 3B. The second device has a channel length L2, which, in this example, is greater than the channel length L1 of FIG. 3A. This second device is similar to the first device and some description is omitted herein. For additional details, please see the description above for FIG. 3A.

A well region 304 having a first type conductivity is formed and/or present on a semiconductor body or substrate 302. The well region 304 typically has a relatively low dopant concentration.

First and second drain extension regions 306 and 308 are formed within the well region 304. The first and second drain extension regions 306 and 308 are symmetrical and have a second conductivity type, opposite the conductivity type of the well region 304. A back gate region 322 is also formed within the well region 304 in between the first and second drain extension regions 306 and 308. The back gate region has the same conductivity type as the well region 304, but typically has a higher dopant concentration. The back gate region 308 has a selected back gate length S1 and dopant concentration according to a desired and/or selected threshold voltage for the device.

Isolation structures 310 are present to isolate individual transistor devices. The isolation structures 310 can be local oxidation structures (LOCOS), shallow trench isolation regions (STI), or another suitable integrated circuit isolation scheme. Typically, these are formed prior to the well region 304 or the drain extension regions 306 and 308 formation.

A first source/drain region 314 is formed within the first drain extension region 306. The first source/drain region 314 has the second type conductivity which is opposite that of the well region 304. A second source/drain region 312 is formed within the second drain extension region 308. The second source/drain region 312 has the second type conductivity which is opposite that of the well region 304. The first source/drain region 314 and the second source/drain region 312 are symmetrical.

A gate structure comprising a gate dielectric layer 316, sidewalls 320, and a gate 318 is formed over the well region 304. Generally, the gate structure is formed prior to forming the source region 312 and the drain region 314.

According to the inventors of the present invention, the threshold voltage for the second device is substantially dependent upon the back gate region 322, in particular, the back gate length S2 and the dopant concentration of the back gate region. A drain extension length X2 is from an edge of the drain extension region 306 to a first edge of the gate 320, where the first edge is above the drain extension region 306.

A gap region length G2 is a length from the edge of the drain extension region 306 to an edge of the back gate region 308. The back gate length S2 is a length from a first edge of the back gate region 322 to a second edge of the back gate region 322. The total channel length L2 is equal to 2*X2+ 2*G2+S1.

Thus, the second device has a threshold voltage substantially equal to that of the first device of FIG. 3A despite having a channel length L2 greater than the channel length L1.

The first and second devices are exemplary in nature and are provided in order to facilitate a better understanding of aspects of the present invention. Additionally, it is noted that the back gate lengths S1 and S2 shown in FIGS. 3A and 3B are equal when formed, but can vary after diffusion and/or other processing and have some variations in length. FIGS. 2A and 2B refrain from showing such variations in order to facilitate a better understanding of the present invention.

Additionally, it is appreciated that aspects of the present invention include DEMOS devices and are not limited to HVMOS devices.

Figure 4:
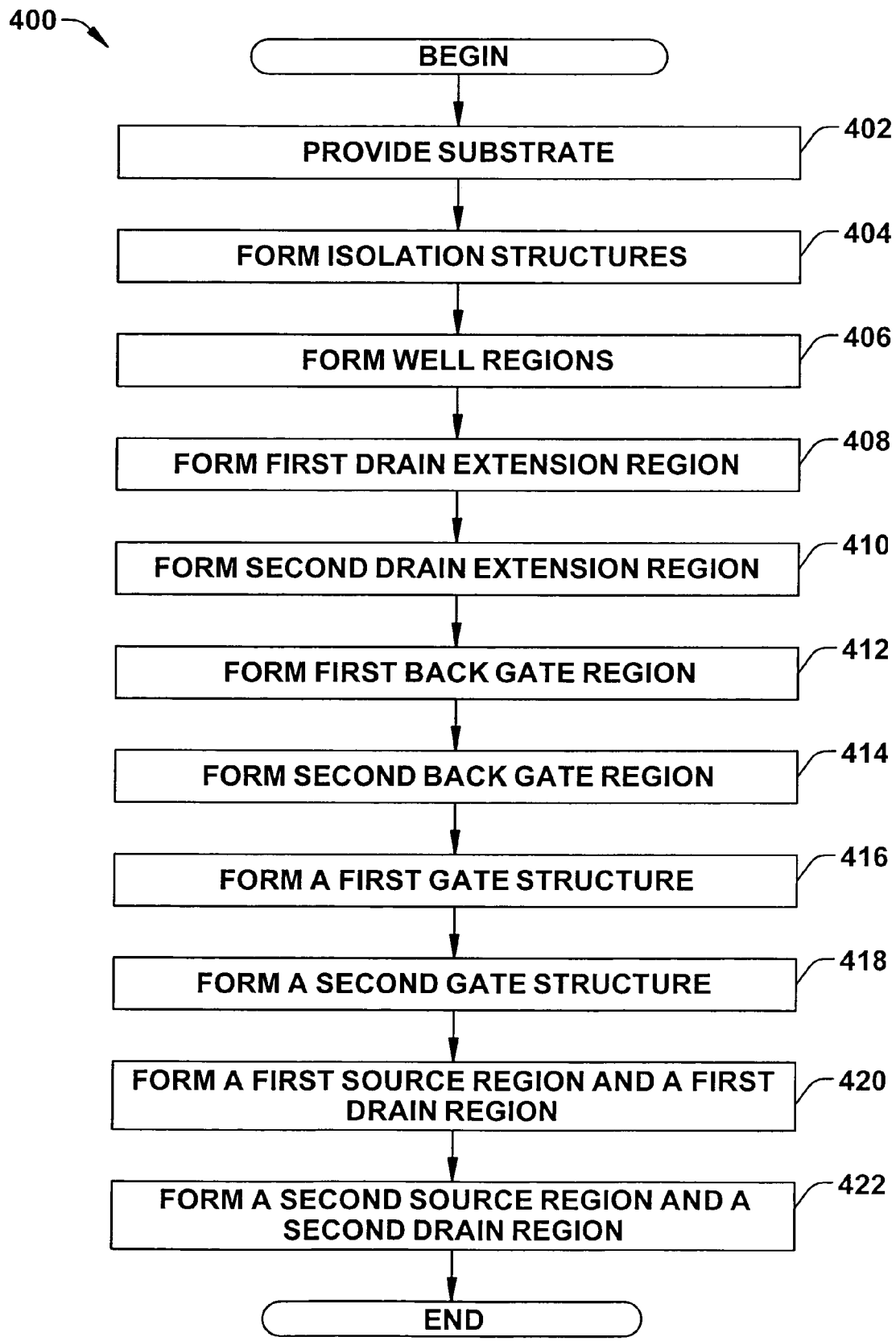
FIG. 4 is a flow diagram illustrating a method of fabricating HVMOS transistor devices with varied channel lengths but similar threshold voltages in accordance with an aspect of the present invention.

FIG. 4 is a flow diagram illustrating a method 400 of fabricating DEMOS or HVMOS transistor devices with varied channel lengths but similar threshold voltages in accordance with an aspect of the present invention. FIGS. 2A and 2B, shown above, can be referenced for additional detail. The method 400 forms first and second asymmetric HVMOS transistor devices having varied channel lengths, but similar threshold voltages.

While, for purposes of simplicity of explanation, the method 400 is depicted and as executing serially. It is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

The method 400 begins at block 402, wherein a semiconductor substrate or body is provided. The semiconductor body is comprised of a semiconductor material such as silicon. The semiconductor substrate or body is typically a wafer and may be doped or undoped.

Isolation structures are formed on the substrate at block 404. The isolation structures serve to electrically isolate individual transistors on the device. The isolation structures can be local oxidation structures (LOCOS), shallow trench isolation regions (STI), or another suitable integrated circuit isolation scheme. LOCOS structures are formed by first depositing oxide and nitride films, which are then patterned and etched to expose areas in the substrate where the isolation structure is required. The substrate is then oxidized to form the isolation structures. STI structures are formed by first etching a trench in the substrate, which is then filled with an insulator comprised of an insulative material, such as, silicon oxide, silicon nitride, and the like.

Well regions, comprised of first and second well regions, are formed are within the semiconductor body at block 406. In one example, n-type or p-type dopant species into the semiconductor body to form n-well and p-well regions, respectively. In another example, the semiconductor body is already suitable doped with a desired dopant and concentration and can serve as the well regions. The well regions have a first conductivity type, for example n-type or p-type. In one example, a p-type well is formed as an epitaxial layer with a dose equal to about 5E14 to about 1E15 per $cm^3$. Other suitable processes can be employed to form well regions in accordance with the invention.

A first drain extension region is formed within a first well region at block 408 according to a first channel length L1. The first drain extension region has a second conductivity type, which is opposite the first conductivity type, and partly defines a first drain extension length X1. A second drain extension region is formed within a second well region at block 410 according to a second channel length L2, which can vary from the length L1. The second drain extension region partly defines a second drain extension length X2.

The drain extension regions are formed by implanting selected dopants with a relatively low dose and low energy. The first and second drain extension regions are formed with a selected dose and energy to yield a desired dopant concentration less than later formed source and drain regions such that the drain extension regions will deplete when as the drain voltage increases.

A first back gate region is formed at block 412 according to the first channel length L1 and a selected threshold voltage. The first back gate region is formed with a back gate length S1 and dopant concentration that yields the selected threshold voltage. In one example, the back gate region is formed by implanting boron with a dose of about 0.5E12 to about 1.0E13 and an energy of about 30 to about 90 KeV. other suitable processes can be employed to form the back gate region.

The first back gate region defines a back gate length S1 and a gap region length G1, which is a distance between an edge of the first back gate region and the first drain extension region. A second back gate region is formed at block 414 according to the second channel length and the selected threshold voltage. Both the first and second back gate regions are formed with a length and dopant concentration that yields the selected threshold voltage. The second back gate region also defines a second back gate length S2 and a second gap region length G2, which is a distance between an edge of the second back gate region and an edge of the second drain extension region. In some instances, the first back gate length S1 and the second back gate length S2 are about equal at formation as is their dopant concentration or the dose employed in formation. In other instances, the first back gate length S1 and the second back gate length S2 can be varied and/or dopant concentrations varied in order to obtain the selected threshold voltage. Additionally, it is also appreciated that the first back gate length S1 and the second back gate length S2 can be varied and/or dopant concentrations varied in order to obtain varied threshold voltages in alternate aspects of the invention.

It is appreciated that the gap region length can be increased without substantially impacting the threshold voltage. Typically, the first gap region length G1 and the second gap region length G2 are selected according to the first and second channel lengths, respectively.

A first gate structure is formed at block 416 over the first well region and comprises a gate dielectric layer, a gate electrode layer, and some sidewall spacers. The first gate structure defines the first channel length L1 and also serves to define the first gap region length G1 and the first drain extension length X1. A second gate structure is formed at block 418 over the second well region and also comprises a gate dielectric layer, a gate electrode layer, and sidewall spacers. The second gate structure is varied in length from the first gate structure and defines the second channel length L2. Additionally, the gate electrode of the second gate structure also serves to define the second gap region length G2 and the second drain extension length X2.

A first source region is formed within the first back gate region and a first drain region is formed within the first drain extension region at block 420. A second source region is formed within the second back gate region and a second drain region is formed within the second drain extension region at block 422.

Other processes, such as thermal processes can also be performed. For example, a rapid thermal anneal can be performed that activates implanted dopants within the source/drain regions. As another example, a suitable anneal can be performed at a temperature of about 1050 Celsius to about 1100 Celsius for a duration of about 300 to about 600 minutes. Additionally, silicide regions can be formed on the gate structures and source/drain regions. For example, suitable silicide regions can be comprised of cobalt (Co), titanium (Ti), and the like. Generally, the silicide regions are formed by applying a mask and sputtering a silicide material (e.g., Co, Ti, and the like) onto the first gate layer. A silicide process is then performed causing the silicide material to react with underlying material (e.g., silicon) thereby forming silicide regions. Additionally, a thermal process or anneal is typically performed. The silicide regions generally provide a lower contact resistance to the first gate layer.

Subsequently, interlayer dielectric layers or other insulative layers can be formed and contacts selectively formed therein. Other layers, including protective layers and metallization layers, can then be performed to complete fabrication of the device.

After fabrication, the resulting back gate lengths (poly overlap) can vary from their initial lengths at formation. Additionally, the resulting back gate lengths can vary from each other or be about equal. Diffusion and/or other fabrication processes can cause slight variations in the back gate lengths from their lengths as implanted. However, even with variations, the electrical performance of both regions is maintained. Additionally, it is noted that the initial lengths at formation can be selected so as to have similar resulting back gate lengths at the completion of fabrication.

Although the method is described with respect to a first and second device, the method also includes forming multiple devices within a region having a first channel length and multiple devices within another region having a second channel length. Additionally, it is appreciated that the method 400 can be extended to multiple devices having varied channel lengths but having fixed or constant back gate lengths, also referred to as POLY overlaps. For example, a third device having a different channel length but with the same back gate length can be formed with this method 400.

Figure 5:
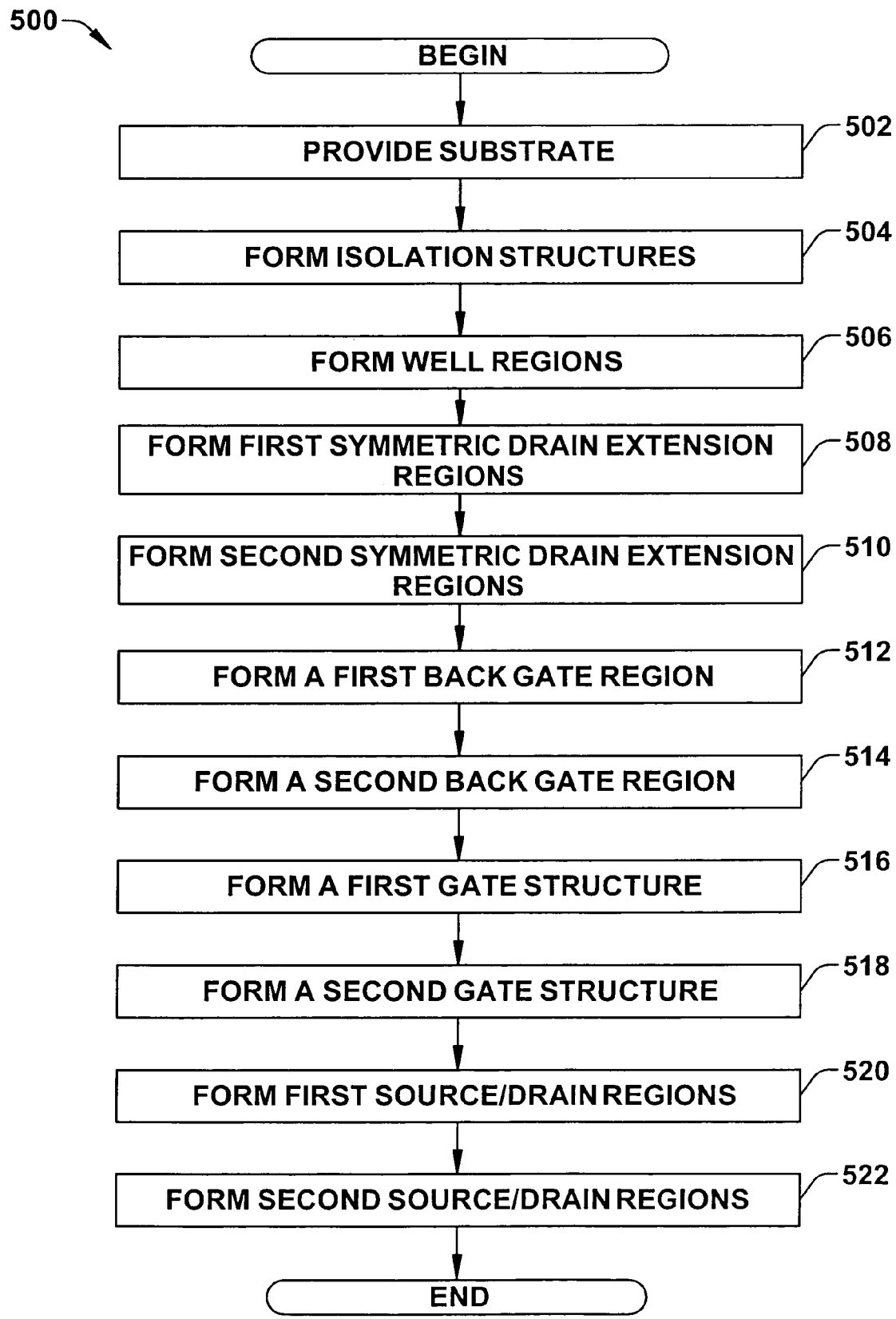
FIG. 5 is a flow diagram depicting a method of fabricating symmetric HVMOS transistor devices having varied channel lengths and substantially similar threshold voltages in accordance with an aspect of the present invention.

FIG. 5 is a flow diagram depicting a method 500 of fabricating symmetric HVMOS transistor devices having varied channel lengths and substantially similar threshold voltages in accordance with an aspect of the present invention. FIGS. 3A and 3B, shown above, can be referenced for additional detail. The method 500 forms first and second symmetric HVMOS transistor devices having varied channel lengths, but similar threshold voltages.

While, for purposes of simplicity of explanation, the method 500 is depicted and as executing serially. It is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

The method 500 begins at block 502, wherein a semiconductor substrate or body is provided. The semiconductor body is comprised of a semiconductor material such as silicon. The semiconductor substrate or body is typically a wafer and may be doped or undoped.

Isolation structures are formed on the substrate at block 504. The isolation structures serve to electrically isolate individual transistors on the device. The isolation structures can be local oxidation structures (LOCOS), shallow trench isolation regions (STI), or another suitable integrated circuit isolation scheme.

Well regions, comprised of first and second well regions, are formed are within the semiconductor body at block 506. The well regions have a first conductivity type, for example n-type or p-type.

First symmetric drain extension regions are formed within the first well region at block 508 according to a first channel length L1. The first symmetric drain extension regions have a second conductivity type opposite the first conductivity type. The first symmetric extension regions define a first drain extension length X1. Second symmetric drain extension regions are formed within the second well region at block 510 according to a second channel length L2, which can vary from the length L1. The second symmetric drain extension regions have the second conductivity type as well. Additionally, the second symmetric drain extension regions define a second drain extension length X2.

A first back gate region is formed at block 512 according to the first channel length L1 and a selected threshold voltage and in between the first symmetric drain extension regions. The first back gate region is formed with a length and dopant concentration that yields the selected threshold voltage. The first back gate region defines a back gate length S1 and a gap region length G1, which is a distance between an edge of the first back gate region and the first drain extension region. A second back gate region is formed at block 514 according to the second channel length and the selected threshold voltage and in between the second symmetric drain extension regions. Both the first and second back gate regions are formed with a length and dopant concentration that yields the selected threshold voltage. The second back gate region also defines a second back gate length S2 and a second gap region length G2, which is a distance between an edge of the second back gate region and an edge of the second drain extension region.

A first gate structure is formed at block 516 over the first well region and comprises a gate dielectric layer, a gate electrode layer, and some sidewall spacers. The first gate structure partially covers the first symmetric drain extension regions and the first back gate region and defines the first channel length L1. A second gate structure is formed at block 518 over the second well region and also comprises a gate dielectric layer, a gate electrode layer, and sidewall spacers. The second gate structure is varied in length from the first gate structure and defines the second channel length. Additionally, the second gate structure partially covers the second symmetric drain extension regions and covers the second back gate region.

First source/drain regions are formed within the first symmetric drain extension regions at block 520. Second source/drain regions are formed within the second symmetric drain extension regions at block 522.

A first symmetric device is formed having the first channel length L1 comprised of $2*X1+2*G1+S1$ and a second symmetric device is formed having the second channel length L2 comprised of $2*X2+2*G2+S2$. Yet the first and the second devices have about the same threshold voltage because the first and second back gate regions have similar lengths (S2=S1) and similar dopant concentrations.

Other processes, such as thermal processes can also be performed. For example, a rapid thermal anneal can be performed that activates implanted dopants within the source/drain regions. Additionally, silicide regions can be formed on the gate structures and source/drain regions. For example, suitable silicide regions can be comprised of cobalt (Co), titanium (Ti), and the like. Generally, the silicide regions are formed by applying a mask and sputtering a silicide material (e.g., Co, Ti, and the like) onto the first gate layer. A silicide process is then performed causing the silicide material to react with underlying material (e.g., silicon) thereby forming silicide regions. Additionally, a thermal process or anneal is typically performed. The silicide regions generally provide a lower contact resistance to the first gate layer.

Subsequently, interlayer dielectric layers and/or other insulative layers can be formed and contacts selectively formed therein. Other layers, including protective layers and metallization layers, can then be performed to complete fabrication of the device.

Although the method 500 is described with respect to a first and second device, the method also includes forming multiple devices within a region having a first channel length and multiple devices within another region having a second channel length. Additionally, it is appreciated that the method 500 can be extended to multiple devices having varied channel lengths but having fixed or constant back gate lengths, also referred to as POLY overlaps. For example, a third device having a different channel length but with the same back gate length can be formed with this method 500.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Additionally, the term "exemplary" is intended to mean an example and not as a best or superior example. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating drain extended semiconductor devices comprising:
    designating a first region of a semiconductor body for devices having a first channel length and a second region of the semiconductor body for devices having a second channel length;
    selecting a common threshold voltage for the first and second regions;
    forming first well regions within the first region;
    forming second well regions within the second region;
    forming back gate well regions in the first and second regions according to the common threshold voltage, wherein the back gate well regions in the first and second regions are formed with an equal back gate length and dopant concentration;
    forming first drain extension within the first region;
    forming second drain extension regions within the second region;
    forming first gate structures within the first region according to the first channel length;
    forming second gate structures within the second region according to the second channel length;
    forming first drain regions within the first drain extension regions;
    forming second drain regions within the second drain extension regions;
    forming first source regions within the back gate well regions within the first region; and
    forming second source regions within the back gate well regions within the second region.

2. The method of claim 1, wherein the equal back gate length is a component of the first channel length and the second channel length.

3. The method of claim 1, wherein the second channel length is a minimum channel length and the first channel length is substantially greater than the second channel length.

4. The method of claim 1, wherein the first well regions have p-type conductivity and the first back gate regions have p-type conductivity.

5. The method of claim 1, wherein the second well regions have n-type conductivity, the second back gate regions have n-type conductivity, and the second drain extension region has p-type conductivity.

6. The method of claim 1, wherein forming the first drain extension region partly defines a first drain extension length, wherein the first drain extension length is a component of the first channel length.

7. The method of claim 1, wherein forming the first gate structures at least partly defines a gap region length and a first drain extension length, wherein the gap region length and the first drain extension length are components of the first channel length.

8. The method of claim 1, further comprising forming isolation regions within the first and second regions.

9. A method of fabricating symmetric drain extended semiconductor devices comprising:
    forming a first well region and a second well region within a semiconductor body;
    forming first symmetric drain extension regions within the first well region according to a first channel length;
    forming second symmetric drain extension regions within the second well region according to a second channel length;
    forming a first back gate region within the first well region in between the first symmetric drain extension regions according to a threshold voltage;
    forming a second back gate region within the second well region in between the second symmetric drain extension regions according to the threshold voltage;
    forming a first gate structure over the first well region defining a first channel region having the first channel length; and forming a second gate structure over the second well region defining a second channel region having the second channel length.

10. The method of claim 9, further comprising forming first source/drain regions within the first symmetric drain extension regions.

11. The method of claim 10, further comprising forming second source/drain regions within the second symmetric drain extension regions.

12. The method of claim 9, wherein the first channel length is greater than the second channel length.

13. The method of claim 9, further comprising selecting the threshold voltage and selecting a dopant concentration and back gate length for the first and second back gate regions.

14. The method of claim 9, wherein the first and second well regions are formed with p-type conductivity and the first and second back gate regions are formed with p-type conductivity.

15. The method of claim 9, wherein forming the first symmetric drain extension partly define a first drain extension length, wherein the drain extension length is a component of the channel length.

16. A method of fabricating a drain extended semiconductor device comprising:
   selecting a threshold voltage and a channel length;
   forming a well region within a semiconductor body;
   forming a drain extension region within the well region;
   selecting a back gate dopant concentration and length according to the selected threshold voltage;
   forming a back gate region within the well region according to the selected back gate dopant concentration and length that provides the selected threshold voltage;
   forming a gate structure over the well region defining the channel length;
   forming a drain region within the drain extension region; and
   forming a source region within the back gate region.

17. The method of claim 16, further comprising forming the drain extension region according to the channel length and independent of the threshold voltage.

18. The method of claim 16, wherein the channel length is a minimum channel length.

19. The method of claim 16, wherein the channel length is greater than a minimum channel length.

20. The method of claim 16, further comprising:
   selecting a second channel length;
   forming a second well region within the semiconductor body;
   forming a second drain extension region within the second well region;
   forming a second back gate region within the second well region according to the selected back gate dopant concentration and length that provides the selected threshold voltage;
   forming a second gate structure over the well region having second channel length;
   forming a second drain region within the second drain extension region; and
   forming a second source region within the second back gate region.

21. The method of claim 20, further comprising:
   selecting a third channel length;
   forming a third well region within the semiconductor body;
   forming a third drain extension region within the third well region;
   forming a third back gate region within the third well region according to the selected back gate dopant concentration and length that provides the selected threshold voltage;
   forming a third gate structure over the well region having third channel length;
   forming a third drain region within the third drain extension region; and
   forming a third source region within the third back gate region.

* * * * *